United States Patent
Pachidis et al.

(10) Patent No.: US 11,905,892 B2
(45) Date of Patent: Feb. 20, 2024

(54) FLOW MACHINE PERFORMANCE MODELLING

(71) Applicant: ROLLS-ROYCE plc, London (GB)

(72) Inventors: Vasileios Pachidis, Derby (GB); Luis E Ferrer-Vidal Espana-Heredia, Derby (GB)

(73) Assignee: ROLLS-ROYCE plc, London (GB)

( * ) Notice: Subject to any disclaimer, the term of this patent is extended or adjusted under 35 U.S.C. 154(b) by 435 days.

(21) Appl. No.: 17/101,932

(22) Filed: Nov. 23, 2020

(65) Prior Publication Data

US 2021/0164402 A1 Jun. 3, 2021

(30) Foreign Application Priority Data

Nov. 29, 2019 (GR) .............................. 20190100541
Jan. 21, 2020 (GB) .................................... 2000875

(51) Int. Cl.
*F04D 27/00* (2006.01)
*F02C 9/16* (2006.01)
(Continued)

(52) U.S. Cl.
CPC .............. *F02C 9/16* (2013.01); *F01D 21/003* (2013.01); *F04D 27/001* (2013.01); *G06F 30/20* (2020.01);
(Continued)

(58) Field of Classification Search
CPC ........ F02C 9/16; F01D 21/003; F04D 27/001; G06F 30/20; F05D 2260/81;
(Continued)

(56) References Cited

U.S. PATENT DOCUMENTS 4,541,237 A 9/1985 Dickey
5,269,136 A 12/1993 Khalid
(Continued)

FOREIGN PATENT DOCUMENTS

AU  2014243206 A1 * 10/2015 ........... F04D 17/122
CN  107 882 636 A    4/2018
GB  1 223 490 A      2/1971

OTHER PUBLICATIONS

Ferrer-Vidal et al Generating axial compressor maps to zero speed, Journal of Power and Energy, 20121, vol. 235(5) 956-973 (Year: 2021).*

(Continued)

*Primary Examiner* — David E Sosnowski
*Assistant Examiner* — Wayne A Lambert
(74) *Attorney, Agent, or Firm* — Oliff PLC (57) ABSTRACT

A method of determining performance characteristics of a flow machine having a rotor interacting with a flow field. The method comprises: receiving performance data for the flow machine comprising data values of a performance parameter of the rotor and mass flow for the flow machine at one or more defined rotor condition, the performance data defining a two-dimensional array of data in which points for a common rotor condition are identifiable; determining or receiving exit mass flow values for the flow downstream of the rotor; and identifying one or more point in the received performance data and interpolating from said one or more point to a corresponding one or more point at a different rotor condition based on a correlation of the exit mass flow values for said points.

20 Claims, 7 Drawing Sheets

(51) Int. Cl.
*F01D 21/00* (2006.01)
*G06F 30/20* (2020.01)
(52) U.S. Cl.
CPC .... *F05D 2260/81* (2013.01); *F05D 2270/304* (2013.01); *F05D 2270/3015* (2013.01); *F05D 2270/3061* (2013.01); *F05D 2270/44* (2013.01)
(58) Field of Classification Search
CPC ....... F05D 2270/3015; F05D 2270/304; F05D 2270/3061; F05D 2270/44; F05D 2220/3216
See application file for complete search history.

(56) References Cited

U.S. PATENT DOCUMENTS

| | | | |
|---|---|---|---|
| 8,403,621 | B2 | 3/2013 | Guemmer |
| 2019/0178256 | A1 | 6/2019 | Farnsworth |
| 2019/0338699 | A1* | 11/2019 | Mohtar ................. F04D 27/001 |
| 2022/0364571 | A1* | 11/2022 | Oakley ................... F04D 29/30 |

OTHER PUBLICATIONS

Roberts et al. Modeling Techniques for a Computational Efficient Dynamic Turbofan Engine Model, International Journal of Aerospace Engineering vol. 2014, Article ID 283479, 11 pages (Year: 2014).*

Tio et al. Considerations on Axial Compressor Bleed for Sub-Idle Performance Models, Proceedings of ASME Turbo Expo 2020 Turbomachinery Technical Conference and Exposition GT2020-144013, Sep. 21-25, 2020, Virtual, Online (Year: 2020).*

Zachos et al. A Physically Enhanced Method for Sub-Idle Compressor Map Generation and Representation, Proceedings of ASME Turbo Expo 2010: Power for Land, Sea and Air GT2010-23562, Jun. 14-18, 2010, Glasgow, UK (Year: 2010).*

Zachos et al. A sub-idle compressor characteristic generation method with enhanced physical background, Journal of Engineering for Gas Turbines and Power Aug. 2011, vol. 133 / 081702, 1-8 (Year: 2011).*

Asianidou et al. A Physically Enhanced Method for Sub-Idle Compressor Map Generation and Representation, Proceedings of ASME Turbo Expo 2010: Power for Land, Sea and Air GT2010 Jun. 14-18, 2010, Glasgow, UK (Year: 2010).*

Feb. 8, 2023 Office Action issued in European Patent Application No. 20206404.4.

Ferrer-Vidal et al., "An enhanced compressor sub-idle map generation method"; Proceedings of GPPS Forum 18 Global Power and Propulsion Society Zurich, Jan. 10-12, 2018.

Apr. 16, 2021 extended Search Report issued in European Patent Application No. 20206404.4.

Ivanov, D. et al., "Fast Compressor Map Computation by Utilizing Support Vector Machine and Response Surface Approximation," 2018 International Joint Conference on Neural Networks (IJCNN), 8 pp.

Janke, C. et al., "Compressor map computation based on 3D CFD analysis," CEAS Aeronaut J., vol. 6, 2015, pp. 515-527.

* cited by examiner

FLOW MACHINE PERFORMANCE MODELLING

CROSS-REFERENCE TO RELATED APPLICATIONS

This specification is based upon and claims the benefit of priority from Greek patent application GR 20190100541 filed on Nov. 29, 2019 and United Kingdom patent application number GB 2000875.1 filed on Jan. 21, 2020, the entire contents of which are incorporated herein by reference.

BACKGROUND

Field of the Disclosure

The present disclosure concerns the modelling of flow machines to understand or predict their performance in operational scenarios where sensed/empirical data is unavailable.

Description of the Related Art

The performance and efficiency of flow machines in the form of compressors and turbines is assessed using a combination of physical testing and computational modelling. The resulting data is used as part of the design process for such machines, i.e. in order to optimise the design for given operational requirements and conditions, as well as in service, e.g. within machine control systems and/or systems for monitoring equipment health.

It is important to have an accurate understanding of the performance of the machine across a full range of operation in order to serve as a point of reference for comparing other/sensed data in the future.

Compressor behaviour throughout the operating envelope is typically described in terms of performance parameters (such as pressure ratio and torque) given as a function of the operating condition characterized by compressor corrected shaft speed and compressor inlet corrected mass flow. This data can either be tabulated or presented in a graphical format by drawing the compressor "characteristics", which are lines describing the compressor performance as a function of inlet corrected mass flow for different values of constant shaft speed. Compressor performance data in this format are typically referred to as "compressor maps" and are used within engine performance modelling tools to characterize the compressor's performance under a range of conditions.

Compressor performance data is typically gathered from experimental tests or analytical methods. Due to the limitations of these approaches, compressor maps are only provided down to the lowest compressor speed reached during test or as attainable by the analytical methods employed. This entails that compressor performance data down to zero speed is not generally available. These unavailable low-speed characteristics are typically termed "sub-idle characteristics" because they are associated to engine operational points occurring below the idling speed.

Figure 1:
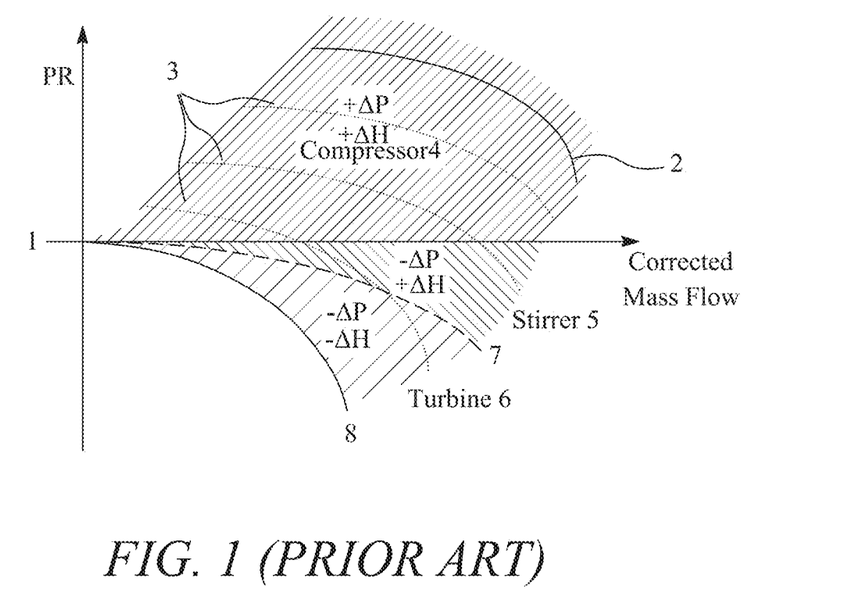
FIG. 1 is an example of a conventional compressor map showing compressor pressure ratio performance characteristics to zero rotor speed.

A representation of compressor pressure ratio characteristics and the different regions is given in FIG. 1, which shows a lowest available/measured characteristic 2 and notional/predicted characteristics 3 down to zero compressor speed.

This sub-idle area of the performance data may be split into three different regimes depending on the work input and pressure rise:
  A compressor (total pressure and total enthalpy rise) regime 4;
  A stirrer or paddle (total pressure drop and total enthalpy rise) regime 5; and,
  A turbine (total pressure and total enthalpy drop) regime 6.

The dividing line between the latter two regimes 5, 6 is a locus of points corresponding to steady-state operation with no net torque operating on the shaft. This line is termed the torque free windmill-line 7. The characteristic corresponding to zero rotational speed is also termed the locked-rotor characteristic, represented by the zero-speed line 8.

In order to develop engine performance models (i.e. computational models such as "synthesis codes" or "engine decks") capable of predicting engine performance down to zero speed, compressor maps extending all the way to zero speed are required. As this data may not be generally available, a small number of methods are conventionally used to extend the performance data to lower speeds. Such methods rely on extrapolating the existing data. Certain known methods try to improve on this by including some calculation of the compressor locked rotor 8 and torque-free 7 performance, which is then used to interpolate the rest of the data.

Regardless which method is used, some form of interpolation/extrapolation of data is required. In order to do this, lines need to be defined that join points on the different speed characteristics. These are then used to obtain the data at other speeds.

Figure 2:
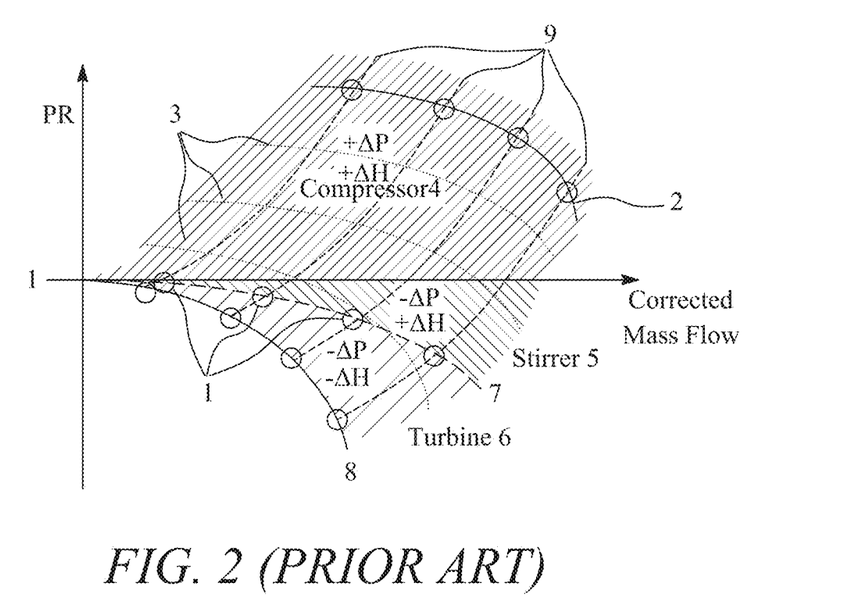
FIG. 2 is the conventional compressor map of FIG. 1 showing beta lines used for interpolation to generate sub-idle characteristics.

The use of these lines comes about from the need to tabulate data in such a way that can be used for interpolation or loaded into a computer program. These lines are typically referred to as "beta-lines" or "R-lines" and do not carry any physical meaning. A compressor performance map down to zero speed is shown in FIG. 2, with these beta-lines 9 shown joining points on seemingly calculated locked rotor and windmill lines with the above-idle data 2. From these lines, the rest of the sub-idle characteristics 3 can then be calculated, i.e. by determining the points of intersection 1 between the beta lines 9 and sub-idle characteristic lines 3 by following the beta line 9 for a distance from the known characteristic 2 or calculated zero-speed characteristic 8.

The need for these beta lines may be further understood by reference to tabulated performance data, as used by some existing computational models. If the compressor pressure ratio were tabulated in terms of corrected inlet flow and compressor speed, undefined regions in said tables would emerge owing to the fact that the characteristics do not span the same flows at different speeds.

Figure 3:
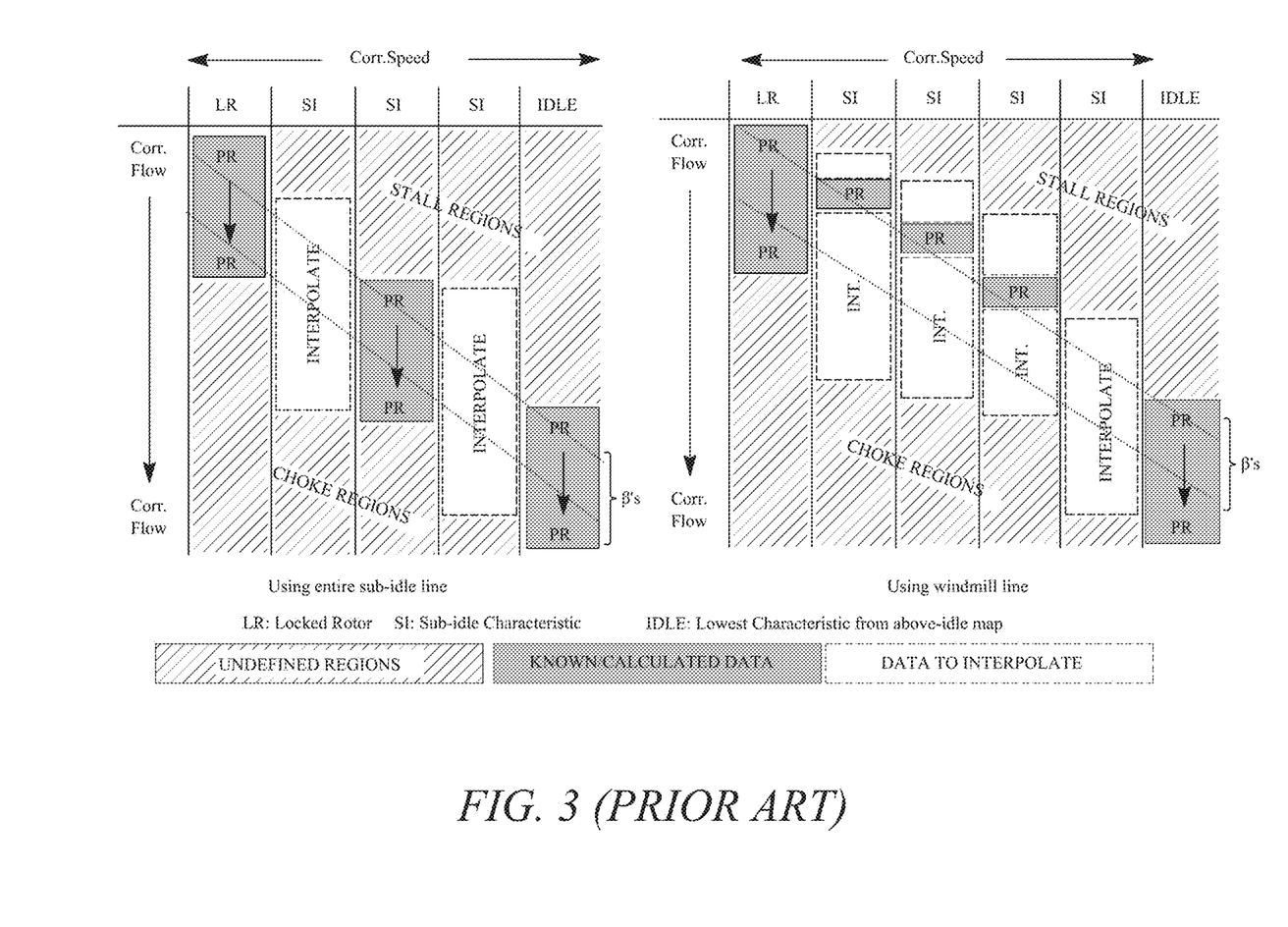
FIG. 3 shows a prior art example of tabulated notional compressor pressure ratio data in terms of inlet corrected mass flow and corrected shaft speed.

FIG. 3 shows such tabulation of the data. The table on the left shows the arrangement that would occur if interpolation were attempted between characteristics of different constant speed, while the one on the right shows the case for interpolation using a torque-free windmill characteristic (which is not constant-speed).

Figure 4:
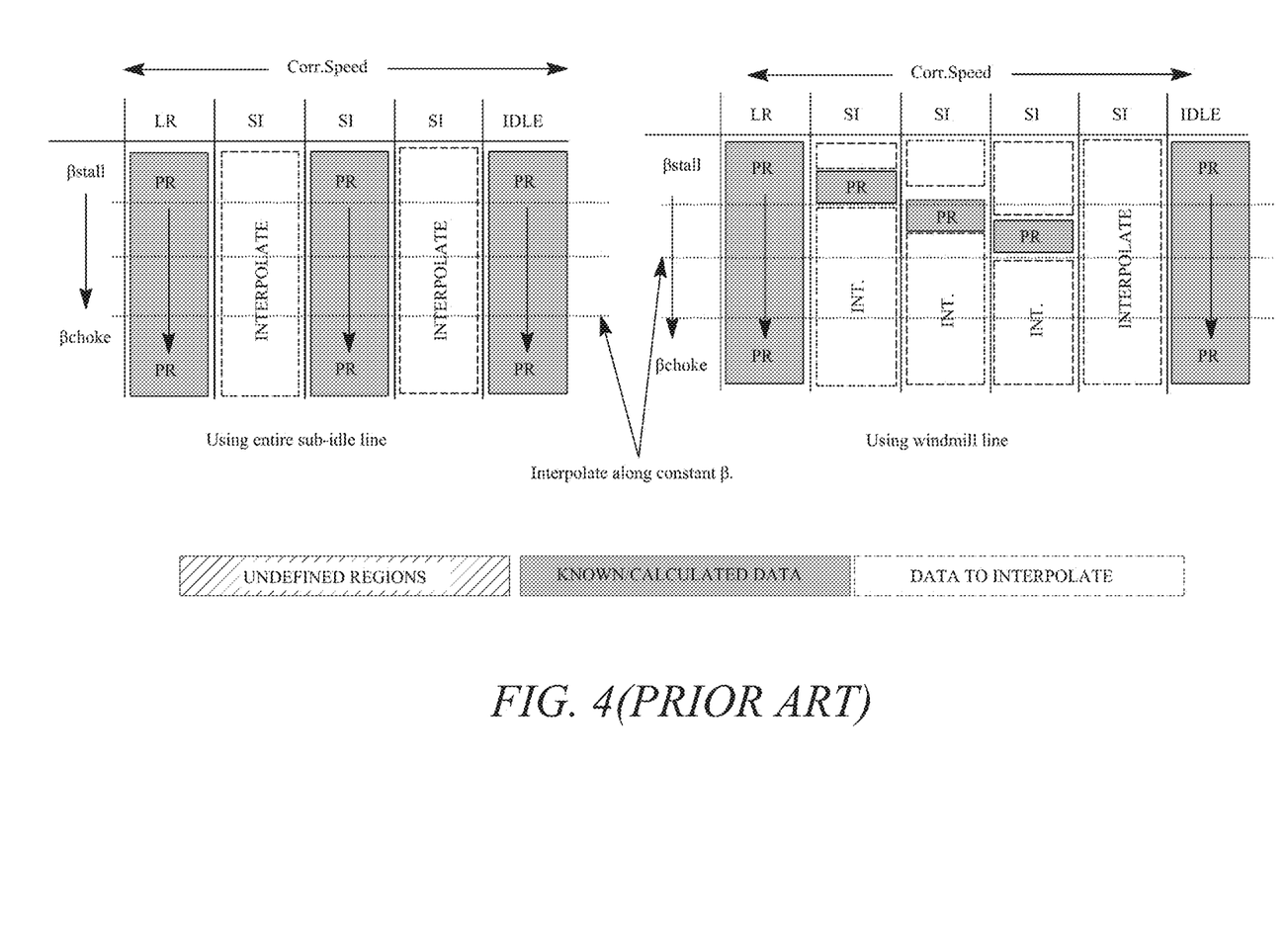
FIG. 4 shows an example of the performance data of FIG. 3 tabulated in terms of beta line and corrected speed.

As seen in FIG. 3, undefined areas emerge due to the compressor stall and choke regions precluding operation for that combination of inlet flow and speed. This gives rise to a diagonal shape in the tabular data. Assigning a value to different parallel diagonals is what defines the beta-lines 1 used in FIG. 2 according to the prior art methods. By assigning these to each diagonal, the data can be re-tabulated in terms of corrected shaft speed and beta as the input parameters, eliminating undefined regions. This is shown in FIG. 4. These beta-lines are purely an artificial construct to allow manipulation of the data.

While the use of beta lines for interpolation purposes is known, there is no standard method for defining and applying them. Random placement of beta lines provides variable shapes and variable results limiting their use in specific applications.

United States patents U.S. Pat. Nos. 5,269,136 and 4,541,237 disclose certain uses of sub-idle performance data, e.g. in control schemes. U.S. Pat. No. 5,269,136 A discloses use in a system involving variable area exhaust nozzle control and fuel delivery control to provide stability enhancement and rotating stall recovery. U.S. Pat. No. 4,541,237 discloses sub-idle control for a turbine engine involving a valve system for a pressure restrictor and sensor system. Neither document discusses how the compressor map is created.

Whilst the introduction of beta lines allows the tabulation of data in such a way that it can be interpolated, problems exist in that there is no way to discriminate between different arrangements as to their location on the compressor map. The intersection of the beta lines 1 with the underlying characteristics 2 creates a system of coordinates along which interpolation takes place. In performing the interpolation, a functional relationship is assumed to join points on the same artificial beta line 1, so that the location of these beta lines influences the shape of the interpolated characteristics.

However there is no way of being certain that the beta line definition that is selected is accurate. Significant variation in beta line shape could be attempted, resulting in different maps being created for the sub-idle region and the selection of a most promising beta line, and associated map, is—at least in part—down to an engineer's judgement. It has been found that the possible variation in the beta line shape/placement and the resulting differences in the derived/notional characteristics can have significant impact when the compressor map is used for engineering purposes, such as design, health monitoring and/or control of flow machines.

The issue of beta line placement has been found to be especially troublesome with regards to the choking region of the performance data.

It is an aim of the present disclosure to provide a method of modelling flow machines which overcomes or mitigates one or more of the above-identified problems.

SUMMARY OF THE DISCLOSURE

According to a first aspect there is provided a method of determining performance characteristics of a flow machine having a rotor interacting with a flow field, the method comprising the steps of: receiving performance data for the flow machine comprising data values of a performance parameter of the rotor and mass flow for the flow machine at one or more defined rotor condition, the performance data defining a two-dimensional array of data in which points for a common rotor condition are identifiable; determining or receiving exit mass flow values for the flow downstream of the rotor; and identifying one or more point in the received performance data and interpolating from said one or more point to a corresponding one or more point at a different rotor condition based on a correlation of the exit mass flow values for said points.

According to a second aspect, there is provided a data carrier or computer storage medium comprising machine readable instructions for a data processor to determine performance characteristics of a flow machine having a rotor interacting with a flow field, by: receiving performance data for the flow machine comprising data values of a performance parameter of the rotor and mass flow for the flow machine at one or more defined rotor condition, the performance data defining a two-dimensional array of data in which points for a common rotor condition are identifiable; determining or receiving exit mass flow values for the flow downstream of the rotor; identifying one or more point in the received performance data and interpolating from said one or more point to a corresponding one or more point at a different rotor condition based on a correlation of the exit mass flow values for said points.

According to a third aspect, there is provided a system for analysing flow machine behaviour, comprising: a flow machine having a rotor arranged to interact with a flow field in use and a plurality of sensors for sensing performance parameter values for the rotor and an operational rotor condition; and, a data processor arranged to receive the performance parameter values data values and mass flow values for the flow machine at one or more defined rotor condition value, the performance parameter and mass flow values defining a two-dimensional array of data in which points for a common rotor condition are identifiable, determine or receive exit mass flow values for the flow downstream of the rotor, identify one or more point in the received performance data and interpolate from said one or more point to a corresponding one or more point at a different rotor condition based on a correlation of the exit mass flow values for said points.

The corresponding one or more points for the different rotor condition may be output, e.g. as a predicted performance parameter value for the different rotor condition.

The defined rotor condition may comprise a fixed rotor speed.

The performance parameter of the rotor may comprise a pressure change across the rotor and/or a parameter derived therefrom. The pressure change may be represented as a pressure ratio. The performance parameter may be derived from pressure (change) and/or temperature. The performance parameter may comprise a power parameter, e.g. for the rotor and/or equipment associated therewith.

The points in the performance data corresponding to a common rotor condition may define a pattern, e.g. a geometric pattern, such as a line or band/zone in the two-dimensional data array. The shape/direction of the pattern/line may be identified. One or more further points for the common rotor condition may be identified as lying within the identified pattern/line.

The two-dimensional array of data may comprise or be represented as a map, such as a performance map (e.g. a compressor/turbine map).

The received performance data may comprise inlet mass flow values for the rotor. The exit mass flow values may be calculated from the inlet mass flow values, e.g. by removing mass flow offtake between the inlet and outlet.

The determined or received exit mass flow values may define a geometric pattern, such as a line or band/zone in the two-dimensional data array along which interpolation can be performed. A continuous line/band may be defined.

The interpolation may comprise interpolating from the identified point in the received performance data to a corresponding point at the different rotor condition based on following a line of constant exit mass flow in the two-dimensional array.

The interpolation may comprise moving from the identified point in a direction of constant exit mass flow by determined distance to identify the location of the corresponding point.

The constant exit mass flow may be constant exit corrected mass flow.

A plurality of points for the different rotor condition may be identified by interpolation. The geometric pattern of the plurality of identified points may be determined in order to define a performance characteristic for the rotor at said different rotor condition.

The different rotor condition may be unknown or unmeasured.

The rotor and/or flow machine may have a flow inlet and a flow outlet of defined geometry. The rotor may be located within a flow passage defining the flow inlet and/or flow outlet.

The skilled person will appreciate that except where mutually exclusive, a feature described in relation to any one of the above aspects may be applied mutatis mutandis to any other aspect. Furthermore, except where mutually exclusive any feature described herein may be applied to any aspect and/or combined with any other feature described herein.

BRIEF DESCRIPTION OF THE DRAWINGS

Embodiments will now be described by way of example only, with reference to the Figures, in which.

DETAILED DESCRIPTION OF THE DISCLOSURE

Specific problems encountered using methods according to the prior art are described below with reference to FIGS. 5 to 7.

Figure 5:
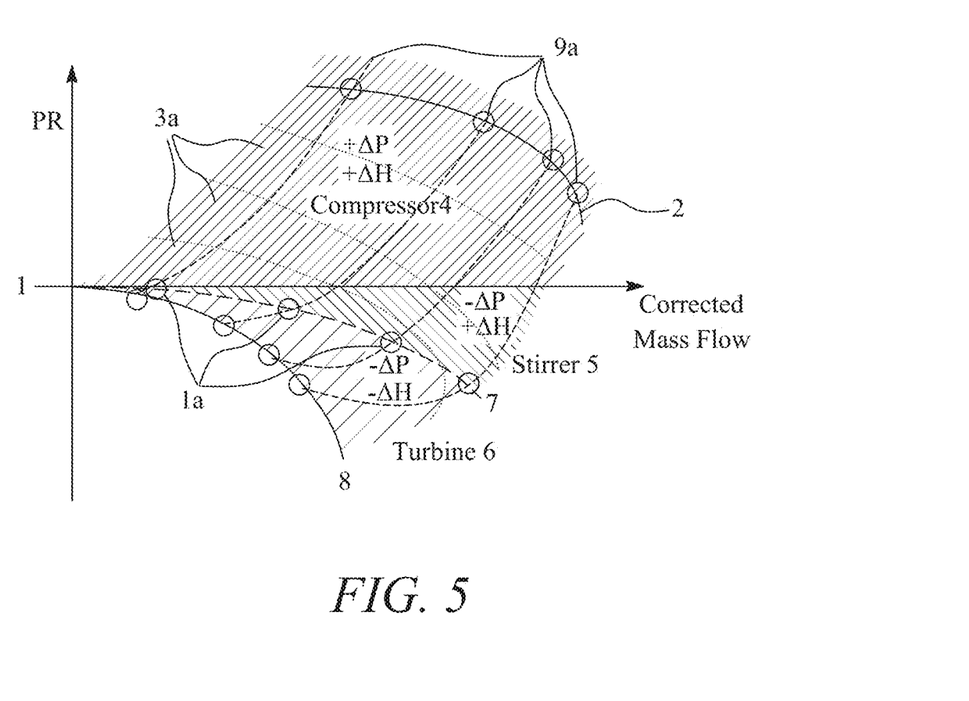
FIG. 5 shows an example compressor map resulting from different interpolation of the data used to generate FIG. 2.
Figure 6:
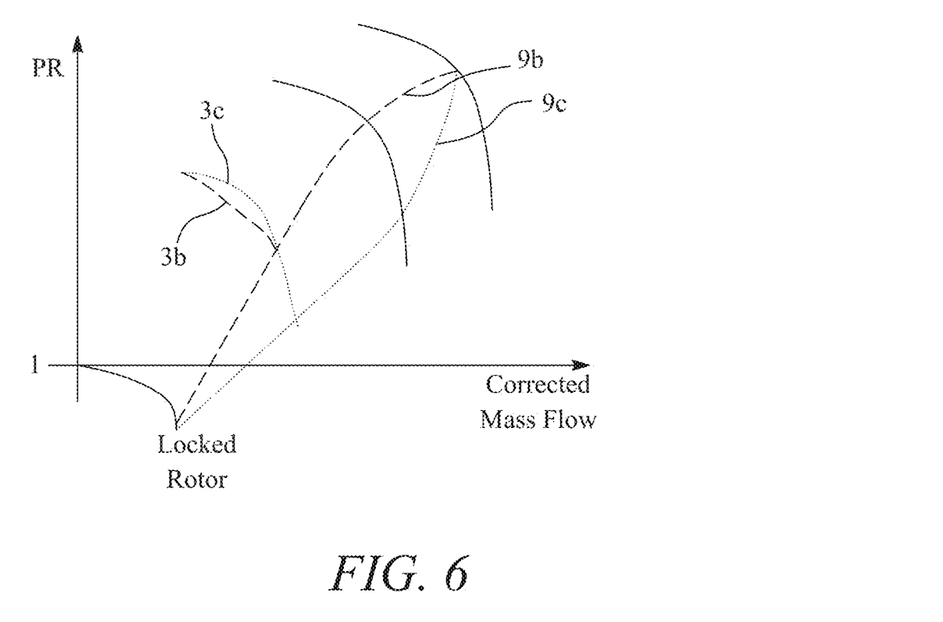
FIG. 6 shows detail of a compressor map showing two different potential beta line placements in the choke region.

FIG. 5 shows an example compressor pressure ratio map. In this map, the same 'boundary data' has been used as in the map of FIG. 2, namely the analytically calculated locked rotor characteristic 8 and the torque-free windmill characteristic 7 have been kept constant between FIGS. 2 and 5, along with the lowest available characteristic 9 from rig data. However the location/shape of the beta lines 9a in FIG. 5 has been altered relative to the beta lines 9 of FIG. 2. This causes the coordinate system created by the beta-characteristic intersection to shift, altering the underlying characteristics 3a in FIG. 5 compared to the characteristic lines 3 in FIG. 2.

This can significantly change the predicted/expected performance of the compressor, i.e. the performance data used for design and/or in-use control/assessment of the compressor.

The issue of beta line placement has been found to be especially troublesome with regards to the choking region of the performance data. As a compressor chokes, its inlet corrected mass flow reaches a maximum value and the characteristic at constant speed becomes increasingly vertical. This raises the question as to how to join points in the choking region of different characteristics. This is illustrated in FIG. 6 in which different beta lines 9b and 9c create different characteristics 3b and 3c in the choke region.

A way to try to mitigate these issues is to select the beta lines such that likely physical characteristics result, manually rejecting beta line arrangements that yield maps which the engineer judges to be flawed. This requires judgement from the engineer that can influence the result. Even after applying sound judgement, different engineers could produce different maps. These different maps can produce different results when put into performance tools.

Figure 7:
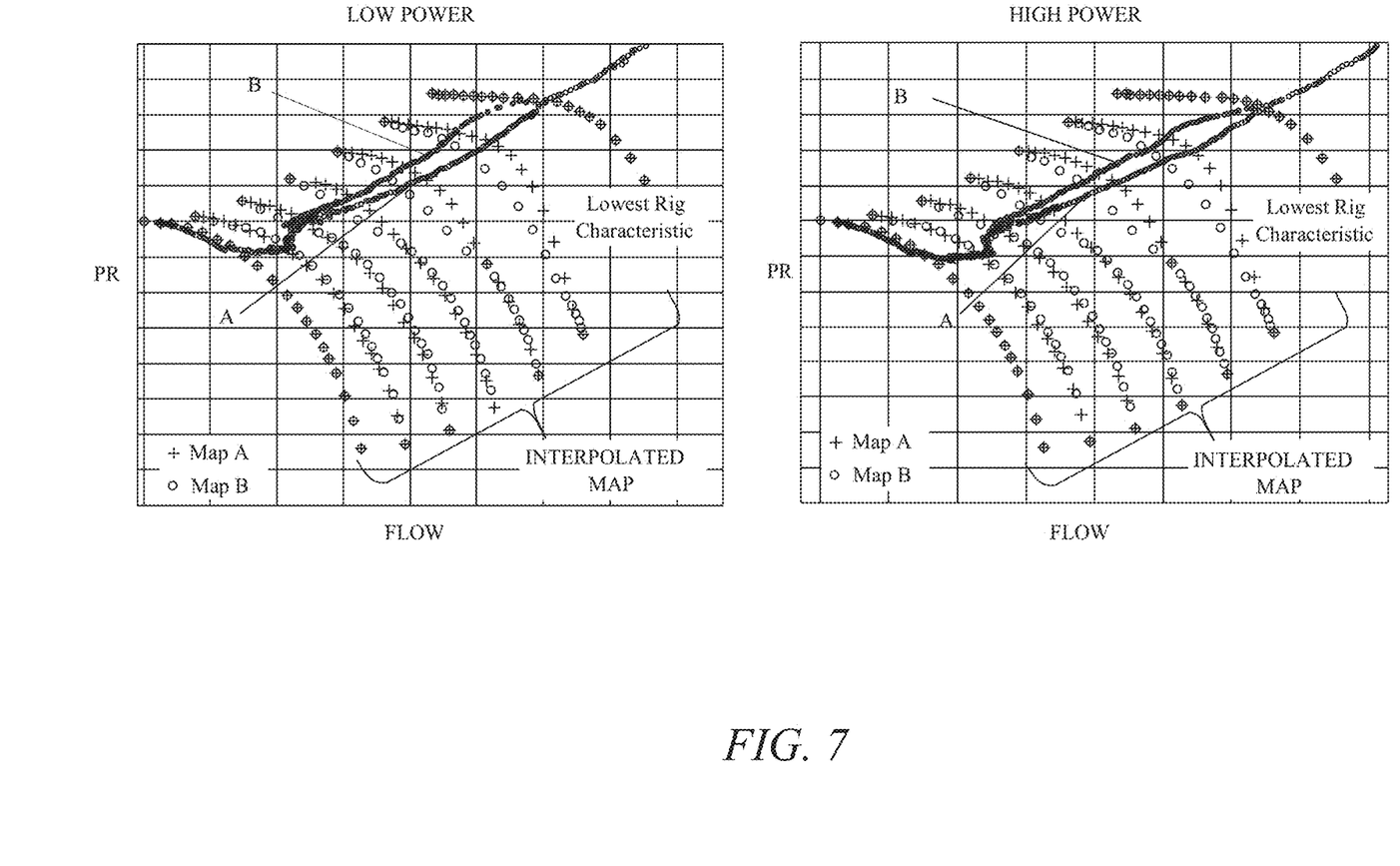
FIG. 7 shows examples of different performance transients resulting from different beta line placements for two different ground start test cases (high and low power starter) for a gas turbine engine compressor.

FIG. 7 shows the transient engine operating lines produced by an engine performance deck using compressor maps interpolated to zero speed with slightly different beta-line arrangements. The different characteristics for the different maps (identified as Map A and Map B) are shown on the same chart for each of a low power and high power plot. In each map, the performance transient for Map A is marked as plot A (i.e. the lower plot) and the performance transient for Map B is marked as plot B (i.e. the higher plot). As can be seen, even though both maps appear quite similar, markedly different performance transients can result in the interpolated area.

The inventors have found that the issues above can be mitigated by assigning a physical meaning to the beta lines used for interpolation. This means that, rather than being entirely abstract lines created only using a two dimensional data array, the beta lines are tied to a physical interpretation. This finding has resulted unexpectedly from analysis of the data and the realisation that it is possible to substitute conventional beta lines with beta lines derived from the downstream/exit mass flow for the compressor.

This gives rise to a set of physical coordinates, i.e. a new beta line, for the compressor map along which interpolation can take place. Points with the same exit corrected mass flow on different constant-speed characteristics can be joined with the same purpose as that of the conventional beta lines.

The exit corrected mass flow is analogous to the inlet corrected mass flow where the mass flow coming out of the compressor is corrected for total pressure and temperature. The term 'corrected' is used in its normal engineering sense, to represent corrected values for standard atmospheric conditions.

With knowledge of the compressor performance in terms of standard/known parameters (such as total pressure ratio and efficiency or torque) as a function of inlet corrected mass flow, the exit corrected mass flow can be calculated. Therefore, a single value of exit corrected mass flow exists for each point on a constant speed characteristic.

Typical parameters are inlet corrected mass flow, pressure ratio, and corrected torque. The exit corrected mass flow may be calculated from these parameters via the following equation:

$$\dot{m}_{ecmf} = \frac{\dot{m}_c}{PR}\sqrt{\frac{\frac{\tau_c N_c \pi}{30\dot{m}_c c_p} + T_{ref}}{T_{ref}}}$$

Where $m_c$ is the corrected mass flow calculated as:

$$\dot{m}_c = \frac{\dot{m}\sqrt{T_{0_1}/T_{ref}}}{P_{0_1}/P_{ref}}$$

$N_c$ is the corrected speed:

$$N_c = \frac{N}{\sqrt{T_{0_1}/T_{ref}}}$$

PR the pressure ratio:

$$PR = \frac{P_{0_2}}{P_{0_1}}$$

And taut$_c$ the corrected torque.

$$\frac{\tau}{P_{0_1}/P_{ref}}$$

P and T are pressure and temperature and '0' subscript stands for stagnation (total) properties. The 'ref' subscript stands for the reference properties used for correction and '1' and '2' stand for inlet and outlet respectively.

Whilst the performance parameters used herein is pressure ratio, a different performance parameter that is a function of the operating condition, such as rotor torque could be used instead. The operating condition may comprise shaft speed or mass flow. Accordingly different maps for a different performance parameter could be generated to the standard compressor/turbine maps shown in the drawings.

Two performance parameters may be to characterize flow machine performance, and both could be interpolated in the same manner. Pressure ratio and torque are used herein but any two could be used (such as enthalpy or isentropic efficiency). However certain parameters may be typically undefined at low rotor speeds, unlike PR and torque, making them well suited for the intended aim.

In the choke region in particular, it can be determined that—while the inlet corrected mass flow is fixed—the dropping total pressure ratio along the characteristic results in distinct values of exit corrected mass flow. This allows distinct points to be defined and the choke region to be defined for the compressor with much better certainty.

Figure 9:
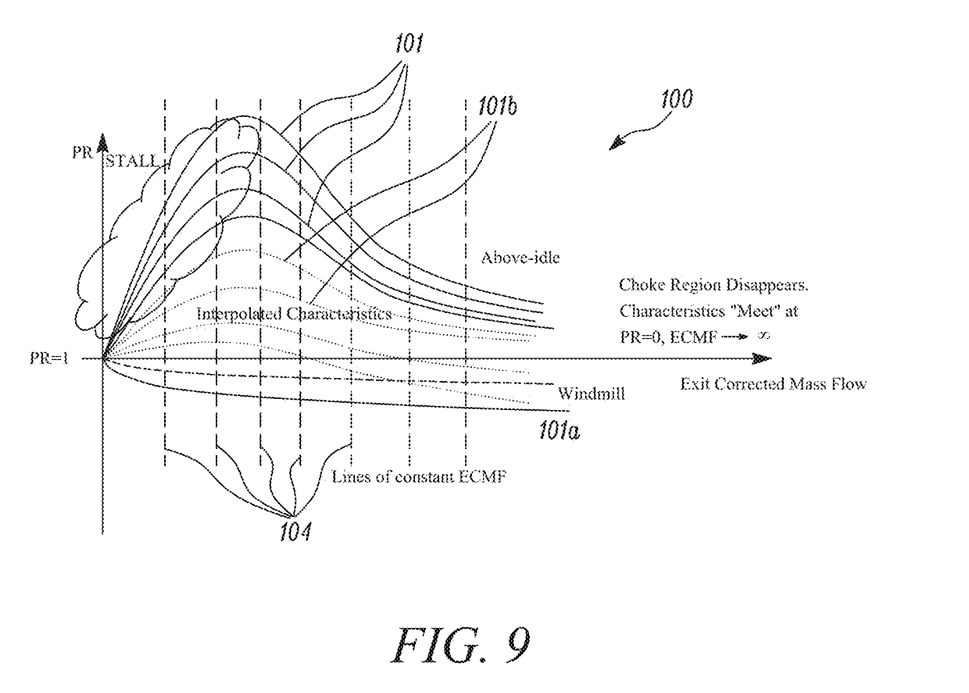
FIG. 9 shows a compressor pressure ratio map generated in terms of exit corrected mass flow in accordance with an example of the disclosure.

Converting a pressure ratio map in terms of inlet corrected mass flow to one in terms in exit corrected mass flow would yield a map 100 in the form shown in FIG. 9. The map 100 represents a chart of pressure ratio, PR, against exit corrected mass flow. The characteristics are therefore lines 101 on the chart each representing a plot for a different rotational speed. Measured or calculated (e.g. in the case of the locked rotor characteristic 101a) characteristic lines 101 can be traced on the map 100. The above idle lines 101 can be plotted based on prior experimental/sensed data and interpolated characteristics 101b can be determined there-from using lines of constant exit corrected mass flow 104.

Lines of constant exit corrected mass flow (ECMF) 104 are represented as vertical lines in the orientation of the map shown in FIG. 9, along which interpolation can take place.

The interpolated characteristics are a result of interpolation along the constant exit corrected mass flow lines so the intersection points are not a choice. Any set of exit corrected mass flow lines may be chosen for interpolation as required.

The inlet corrected mass flow of a downstream component is equal to the upstream component's exit corrected mass flow. This entails that if a component remains choked through a range of conditions, the upstream component would operate along a line of constant exit corrected mass flow through the same operational range. Carrying interpolation along such lines is then physically justified, as the interpolation function used can be based on the known operational trend.

Accordingly, the newly proposed method is to carry out interpolation on lines of constant exit corrected mass flow in lieu of the artificial beta lines.

Figure 10:
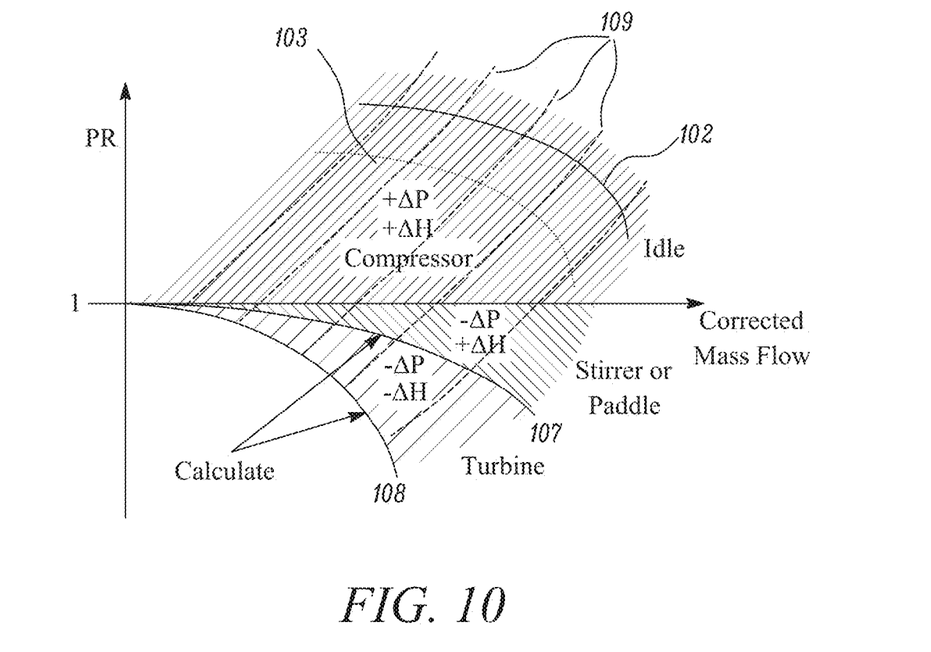
FIG. 10 shows an example compressor map with interpolation lines of constant exit corrected mass flow according to the disclosure.

Turning now to FIG. 10, the previous beta lines have been replaced by new lines of constant exit corrected mass flow 109.

When the lines of exit corrected mass flow 109 are substituted for the previous beta lines 9, 9a described above, this yields a predictable line along which interpolation can take place. Interpolation from the received/measured characteristics (e.g. comprising the lowest available measured characteristic 102) and/or a calculated characteristic (e.g. characteristic corresponding to zero rotational speed 108 or torque-free/windmilling characteristic 107) can be undertaken to determine the point of intersection with predicted/interpolated characteristics 103. Thus, interpolated characteristics 103 can be defined for various different rotor speeds by points of intersection with lines 109.

Whilst the focus in this disclosure has been to identify characteristics 103 for sub-idle rotor operation (i.e. particularly low rotor speeds, e.g. from a lowest obtainable characteristic 102 down to zero) the same method could be used to identify performance characteristics anywhere in the intended operational range of the flow machine. The method can be used to determine a performance characteristic at any specific rotor speed for which existing data is not available.

The approach described herein ensures that the interpolation is carried out only on lines that represent a known physical process. This entails that the resulting interpolated map will always be the same.

At its core, the new approach may be described as a performance data interpolation method for a flow machine rotor that makes use of physical coordinates of exit corrected mass flow as the auxiliary coordinate, instead of auxiliary coordinates devoid of physical significance.

The proposed method seeks to replace the definition of an auxiliary interpolation coordinate devoid of any physical meaning by one based on exit corrected mass flow. This results in an unambiguous and consistent arrangement of performance data so that it can be interpolated in a consistent manner and eliminating the need of user judgement to drive how the interpolation is performed. Furthermore, it has been found that the use of the exit corrected mass flow may remove the ambiguity conventionally present in choked turbomachinery characteristics, e.g. where performance data would asymptote to the choking value of inlet corrected mass flow.

As opposed to the prior art, this method does not require the user to make decisions as to how the interpolated performance data should behave, removing a significant source of inconsistency in the interpolation of compressor performance data to zero speed.

Figure 8:
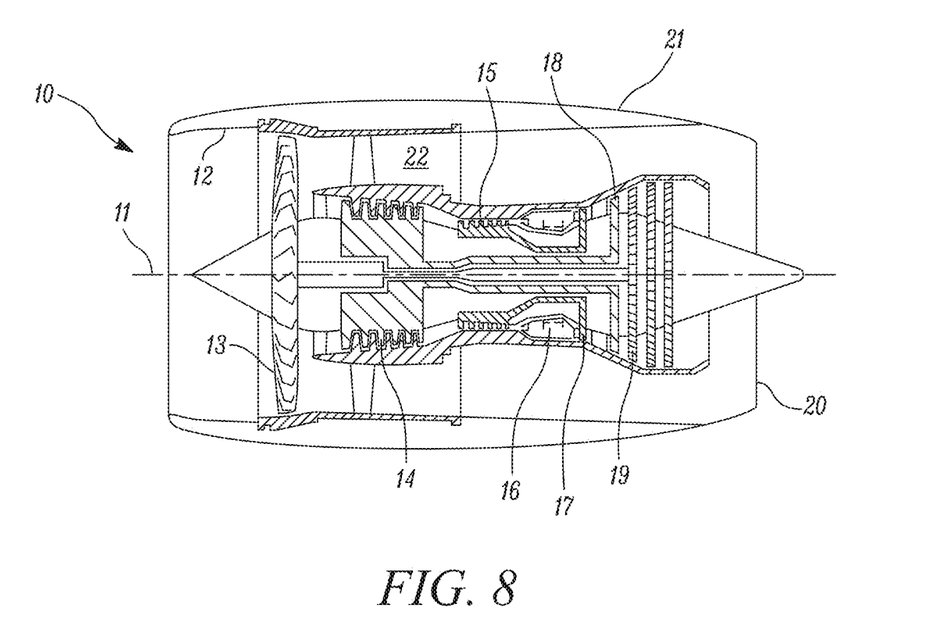
FIG. 8 shows a sectional side view of a gas turbine engine.

Turning now to FIG. 8, there is shown an example of a flow machine in the form of a gas turbine engine 10. The findings disclosed herein were initially discovered by studying compressor behaviour of the gas turbine engine 10. The findings may apply to any compressor of the gas turbine engine 10.

With reference to FIG. 8, a gas turbine engine is generally indicated at 10, having a principal and rotational axis 11. The engine 10 comprises, in axial flow series, an air intake 12, a propulsive fan 13, an intermediate pressure compressor 14, a high-pressure compressor 15, combustion equipment 16, a high-pressure turbine 17, an intermediate pressure turbine 18, a low-pressure turbine 19 and an exhaust nozzle 20. A nacelle 21 generally surrounds the engine 10 and defines both the intake 12 and the exhaust nozzle 20.

The gas turbine engine 10 works in the conventional manner so that air entering the intake 12 is accelerated by the fan 13 to produce two air flows: a first air flow into the intermediate pressure compressor 14 and a second air flow which passes through a bypass duct 22 to provide propulsive thrust. The intermediate pressure compressor 14 compresses the air flow directed into it before delivering that air to the high pressure compressor 15 where further compression takes place.

The compressed air exhausted from the high-pressure compressor 15 is directed into the combustion equipment 16 where it is mixed with fuel and the mixture combusted. The resultant hot combustion products then expand through, and thereby drive the high, intermediate and low-pressure turbines 17, 18, 19 before being exhausted through the nozzle 20 to provide additional propulsive thrust. The high 17, intermediate 18 and low 19 pressure turbines drive respectively the high pressure compressor 15, intermediate pressure compressor 14 and fan 13, each by suitable interconnecting shaft.

Other gas turbine engines to which the present disclosure may be applied may have alternative configurations. By way of example such engines may have an alternative number of interconnecting shafts (e.g. two) and/or an alternative number of compressors and/or turbines. Further the engine may comprise a gearbox provided in the drive train from a turbine to a compressor and/or fan.

The method described here for compressor maps could also be applied to the interpolation of turbine maps to zero speed, or to interpolate any other region of said maps.

The method here proposed could generally be applied to any turbomachinery component where a change in total pressure or temperature occurs across such component. Indeed the method described herein could be applied to other compressor and/or turbine flow machine types, e.g. particularly those having a defined inlet and outlet/exit geometry for the flow machine.

The disclosure herein may be applied to a process for designing a flow machine. That is to say the method described above may be used to determine whether a specific design of rotor or flow machine is suitable to meet operating requirements across a range of possible flow conditions and/or rotor speeds. In the event that the interpolation of performance characteristics yields a compressor map that is deficient in some regard, the rotor or flow machine design may be modified. Additionally the implementation of the method in a design process may extend to the design of accessories or other equipment that is operationally-linked to, or impacted by, the flow machine. For example, such equipment may need to be designed to accommodate or prevent possible stall, surge onset and/or other flow or rotor-performance based phenomena.

Designs may be accepted or rejected based on the generated map. A decision to iterate on a design process may be taken based on the generated map or information derived there-from.

For a flow machine in service, the correct interpretation of operational data from the machine may require reference to the map. Control decisions and/or operational health of the machine may be determined, at least in part, by reference to the map or associated data generated by way of the present disclosure. For example, a decision about whether or not inspection, repair or overhaul of the flow machine or rotor may be made with reference to the flow machine performance, e.g. by comparison of sensed data with the map or by application of the interpolated performance characteristics to sensed or predicted data/scenarios.

The engine/machine 10 in FIG. 8 may have an on-board processor, such as an engine control unit (ECU), which may have access to data for the performance characteristics generated using the methods described herein. Such performance characteristics may be used as part of monitoring or control settings. As distinct from active control of the engine 10, an onboard processor and/or data store may be provided for equipment health monitoring applications, e.g. whereby operational behaviour of the machine can be logged and assessed against predetermined performance/operational data.

Figure 11:
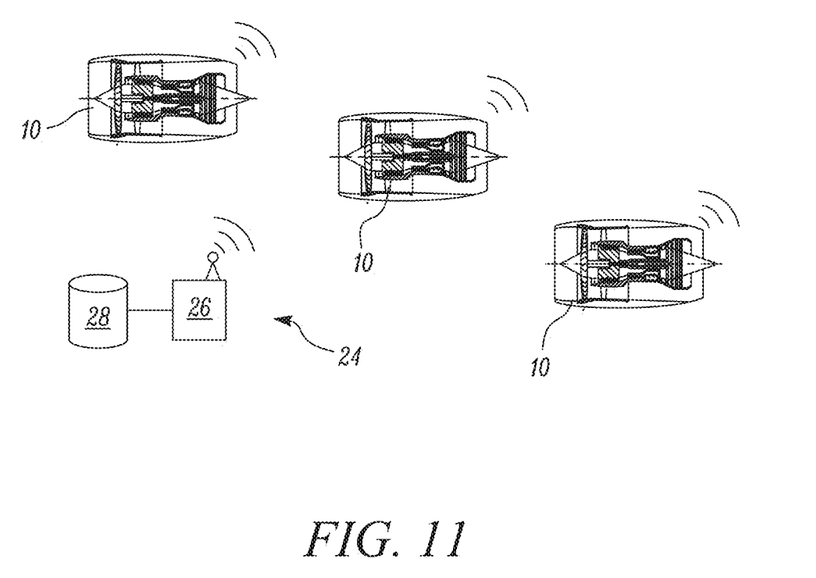
FIG. 11 shows an example monitoring system for flow machines in which the performance data generated according to the disclosure is used.

With reference to FIG. 11, a remote monitoring facility 24 may receive the operational data from a plurality of machines/engines 10 in service. Thus the data processor 26 and/or data store 28 for equipment health monitoring applications may be onboard the machine or remote there-form. A combination of on-board and remote processing of data may be used. In monitoring operational health, the performance characteristics generated using the approach disclosed herein may provide predetermined performance data which can be compared to current operational data for assessment of operational health of the flow machine. Additionally or alternatively, the methods used herein may be used to generate a new performance characteristic for received operational data of assessment/diagnosis of the machine.

The equipment health assessment may be used to diagnose potential future failure modes or faults and/or to identify machines or ancillary components that are demonstrating abnormal behaviour. The data processor 26 may output corresponding signals indicative of abnormal current/predicted behaviour.

The equipment health assessment may be used to schedule machine inspection, servicing, repair or overhaul/replacement.

It is therefore important to have an accurate understanding of the performance of the machine across a full range of operation in order to serve as a point of reference for comparing other/sensed data in the future.

Examples of the disclosure may provide one or more of the following potential benefits:
  providing a method for interpolating performance data for
    a gas turbine engine, more specifically a compressor or a turbine, used in preparation of accurate performance maps e.g. compressor maps or turbine maps;

generating otherwise unavailable low-speed characteristics known as "sub-idle characteristics";

improving the consistency of interpolated performance data/characteristics for a flow machine;

eliminating the need of user judgement to drive how interpolation is performed to predict performance data/characteristics;

informing the design of a new flow machine by modelling/simulating performance (including whole engine performance)

modelling/simulating and/or assessing the performance of engines that are in service to predict in service performance (e.g. including whole engine performance).

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

We claim:

1. A method of determining performance characteristics of a flow machine having a rotor interacting with a flow field, the method comprising:
   receiving performance data for the flow machine comprising data values of a performance parameter of the rotor and mass flow for the flow machine at one or more defined rotor condition, the performance data defining a two-dimensional array of data in which points for a common rotor condition are identifiable;
   determining or receiving exit mass flow values for the flow downstream of the rotor; and
   identifying one or more point in the received performance data and interpolating from the one or more point to a corresponding one or more point at a sub-idle rotor condition based on a correlation of the exit mass flow values for the points.

2. The method of claim 1, wherein the one or more corresponding point represents a predicted performance parameter value for the sub-idle rotor condition.

3. The method of claim 1, wherein the defined rotor condition comprises a fixed rotor speed.

4. The method of claim 1, wherein the received performance data comprises one or more rotor speed.

5. The method of claim 1, wherein the performance parameter of the rotor comprises a pressure change across the rotor.

6. The method of claim 1, wherein the points in the performance data corresponding to the common rotor condition define a line in the two-dimensional data array.

7. The method of claim 1, wherein the two-dimensional array of data defines a performance map for the rotor.

8. The method of claim 1, wherein the received performance data comprises inlet mass flow values for the rotor and the exit mass flow values are calculated from the inlet mass flow values.

9. The method of claim 1, wherein the exit mass flow values define a line in the two-dimensional data array along which interpolation is performed.

10. The method of claim 1, wherein the interpolation comprises interpolating from the identified point in the received performance data to a corresponding point at the sub-idle rotor condition based on following a line of constant exit mass flow in the two-dimensional array.

11. The method of claim 1, wherein the interpolation comprises moving from the identified point in a direction of constant exit mass flow by a determined distance to identify the location of the corresponding point.

12. The method of claim 1, wherein a plurality of corresponding points for the sub-idle rotor condition are identified by interpolation and a line comprising the plurality of corresponding points in the two-dimensional array is determined in order to define a performance characteristic for the rotor at the the sub-idle rotor condition.

13. The method of claim 1, wherein the flow machine comprises a compressor or turbine of a gas turbine engine.

14. A non-transitory computer readable storage medium comprising machine readable instructions for a data processor to determine performance characteristics of a flow machine having a rotor interacting with a flow field, by:
   receiving performance data for the flow machine comprising data values of a performance parameter of the rotor and mass flow for the flow machine at one or more defined rotor condition, the performance data defining a two-dimensional array of data in which points for a common rotor condition are identifiable;
   determining or receiving exit mass flow values for the flow downstream of the rotor;
   identifying one or more point in the received performance data; and,
   interpolating from the one or more point to a corresponding one or more point at a sub-idle rotor condition based on a correlation of the exit mass flow values for the points.

15. A system for analysing flow machine behaviour, comprising:
   a flow machine having a rotor configured to interact with a flow field and a plurality of sensors for sensing performance parameter values for the rotor and an operational rotor condition; and,
   a data processor configured to
   receive the performance parameter values data values and mass flow values for the flow machine at one or more defined rotor condition value, the performance parameter and mass flow values defining a two-dimensional array of data in which points for a common rotor condition are identifiable,
   determine or receive exit mass flow values for the flow downstream of the rotor,
   identify one or more point in the received performance data,
   interpolate from the one or more point to a corresponding one or more point at a sub-idle rotor condition based on a correlation of the exit mass flow values for the points, and output the corresponding one or more points for the sub-idle rotor condition.

16. The system of claim 15, wherein the one or more corresponding point represents a predicted performance parameter value for the sub-idle rotor condition.

17. The system of claim 15, wherein the defined rotor condition comprises a fixed rotor speed.

18. The system of claim 15, wherein the received performance data comprises one or more rotor speed.

19. The system of claim 15, wherein the performance parameter of the rotor comprises a pressure change across the rotor.

20. The system of claim 15, wherein the points in the performance data corresponding to a common rotor condition define a line in the two-dimensional data array.

* * * * *